(12) United States Patent
Wikström et al.

(10) Patent No.: US 6,407,340 B1
(45) Date of Patent: Jun. 18, 2002

(54) ELECTRIC CONDUCTOR WITH A SURFACE STRUCTURE IN THE FORM OF FLANGES AND ETCHED GROOVES

(75) Inventors: Bo Wikström, Asmundtorp; Lennart Olsson, Malmö, both of (SE)

(73) Assignee: Obducat AB, Malmo (SE)

( * ) Notice: Subject to any disclaimer, the term of this patent is extended or adjusted under 35 U.S.C. 154(b) by 0 days.

(21) Appl. No.: 09/653,941

(22) Filed: Sep. 1, 2000

Related U.S. Application Data

(63) Continuation of application No. PCT/SE99/00326, filed on Mar. 5, 1999.

(30) Foreign Application Priority Data

Mar. 5, 1998 (SE) ................................. 9800709

(51) Int. Cl.[7] ................................. H05K 1/00
(52) U.S. Cl. ................ 174/250; 174/261; 174/255
(58) Field of Search ................. 174/253, 255, 174/261, 250; 428/901; 361/772–779

(56) References Cited

U.S. PATENT DOCUMENTS

| 3,806,841 | A |   | 4/1974  | Brunner |
| 3,990,926 | A |   | 11/1976 | Konicek |
| 4,786,545 | A | * | 11/1988 | Sakuma et al. ............. 428/209 |
| 5,268,064 | A |   | 12/1993 | Woo et al. |
| 5,426,266 | A | * | 6/1995  | Brown et al. ............... 174/267 |
| 5,929,521 | A | * | 7/1999  | Wark et al. ................. 257/737 |
| 6,002,172 | A | * | 12/1999 | Desai et al. ................ 257/737 |
| 6,087,732 | A | * | 7/2000  | Chittipeddi et al. ........ 257/786 |
| 6,124,721 | A | * | 9/2000  | Farnworth et al. .......... 324/758 |
| 6,246,587 | B1 | * | 6/2001 | Chen .......................... 361/773 |

FOREIGN PATENT DOCUMENTS

DE            195 19 582        12/1996

* cited by examiner

*Primary Examiner*—Kanand Cuneo
*Assistant Examiner*—Jeremy Norris
(74) *Attorney, Agent, or Firm*—Finnegan, Henderson, Farabow, Garrett & Dunner, L.L.P.

(57) ABSTRACT

An electronics device comprising a carrier, such as a printed circuit board, a substrate or a chip, and an electric conductor on a surface of the carrier. The surface of the conductor (2) facing away from the carrier has a surface structure (3, 4; 6, 7) in the form of flanges which are defined by etched grooves.

10 Claims, 4 Drawing Sheets

ELECTRIC CONDUCTOR WITH A SURFACE STRUCTURE IN THE FORM OF FLANGES AND ETCHED GROOVES

This application is a Continuation of International Application Number PCT/SE99/00326, filed Mar. 5, 1999, the content of which is incorporated herein by reference.

FIELD OF THE INVENTION

The present invention relates to an electronics device which comprises a carrier, such as a printed circuit board, a substrate or a chip, and an electric conductor on one surface of the carrier.

BACKGROUND ART

Electronics devices such as printed circuit boards, substrates or chips contain different forms of conductor structures. The conductor structures are to be found on the surfaces of or inside said devices. The conductor structures are used to electrically join different components or integrated structures or to connect the device to the surroundings.

Conductor structures of printed circuit boards, substrates or chips consist of conductors which are essentially rectangular in cross-section. Deviations from the rectangular shape depend on the process that is used to manufacture the conductor structure.

An ever increasing working frequency is required in today's electronics products. This causes a number of problems such as high specific resistance, impedance, depending on the skin effect, which implies that the current is essentially carried at the circumferential surface of the conductor.

Moreover, an increasing number of products are designed requiring an increasing current density in the conductors. This causes considerable generation of heat in the conductors, which results in higher temperatures in the conductors. Besides, for different reasons use is made in many electronics constructions of conductor materials which are not the optimal ones in view of electric conducting capacity. In the future it will probably, owing to greater environmental considerations and increased integration requirements, be more common that materials that do not have optimal electrical conducting properties are used in conductor structures.

A further problem with the conductors of today's electronics devices is that it may be difficult to solder components to the conductors or mounting islands connected to the conductors.

An object of the present invention is to provide an electronics device with an electric conductor having improved properties for high current densities and high frequencies.

A further object of the present invention is to provide an electronics device with conductor structures which improve the possibilities of soldering other components.

SUMMARY OF THE INVENTION

These objects are achieved by an electronics device comprising a carrier, such as a printed circuit board, a substrate or a chip, and an electric conductor on a surface of the carrier, characterized in that the surface of the conductor facing away from the carrier has a surface structure in the form of flanges which are defined by etched grooves.

By electronics device is meant a device which comprises at least one conductor.

An electronics device according to the invention comprises a carrier, such as a printed circuit board, a substrate or a chip, and an electric conductor on a surface of the carrier. The electronics device is characterised in that the surface of the conductor facing away from the carrier has a surface structure in the form of flanges which are defined by etched grooves.

The conductor is preferably arranged on a non-metallic surface of the carrier.

According to one aspect of the invention, patterns or surface structures in the conductors are made smaller than the circumferential dimensions of the conductors by using an anisotropic etching method. These patterns or surface structures may consist of, for instance, longitudinal etched flanges. As a result, the heat-emitting surface of the conductors increases from the conductor. One more advantage of the invention is that it permits improved mechanical strength in joints between the conductor and other components which are, for example, fixed to the conductor by soldering or gluing with an electrically conductive glue. The improved strength depends on the increased surface in the joint.

Preferably the flanges are arranged in the longitudinal direction of the conductor. This results in the further advantage that the electric resistance decreases at high frequencies. The skin effect, which means that the current is essentially carried at the circumferential surface of a conductor at high frequencies, causes the electric resistance to increase at high frequencies. This reduction is compensated for by the increased surface of the conductor.

If merely improvement of the heat emission is desired, the flanges may extend transversely of the conductor direction.

When the flanges are oriented in the longitudinal direction of the conductor, the depth of the grooves is preferably smaller than the thickness of the conductor perpendicularly to the surface, but the grooves can also extend over the entire thickness of the conductor, thereby dividing the conductor into separate subconductors.

In the case where the conductor is divided into separate subconductors, they are preferably connected to at least one conductor portion extending in the transverse direction.

When components are to be connected to the conductors, it is advantageous for the conductors to be connected to so-called connection areas. The components are soldered or glued with an electrically conductive glue to the connection area. With a view to improving the mechanical strength in the glue or soldering joint, it is advantageous to provide the surface of the connection area with a surface structure.

The surface structure of the connection area is advantageously produced by etching.

After etching, a non-conductive layer can be arranged on the etched surface. When the device is a printed circuit board, the non-conductive layer may consist of, for instance, a coating film intended to protect the conductor. When the device is an integrated circuit, the non-conductive layer may consist of, for instance, a protective oxide film.

It goes without saying that the above features can be combined in the same embodiment.

In order to further elucidate the invention, detailed embodiments thereof will be described below, without, however, the invention being considered to be restricted thereto.

DETAILED DESCRIPTION

Figure 1:
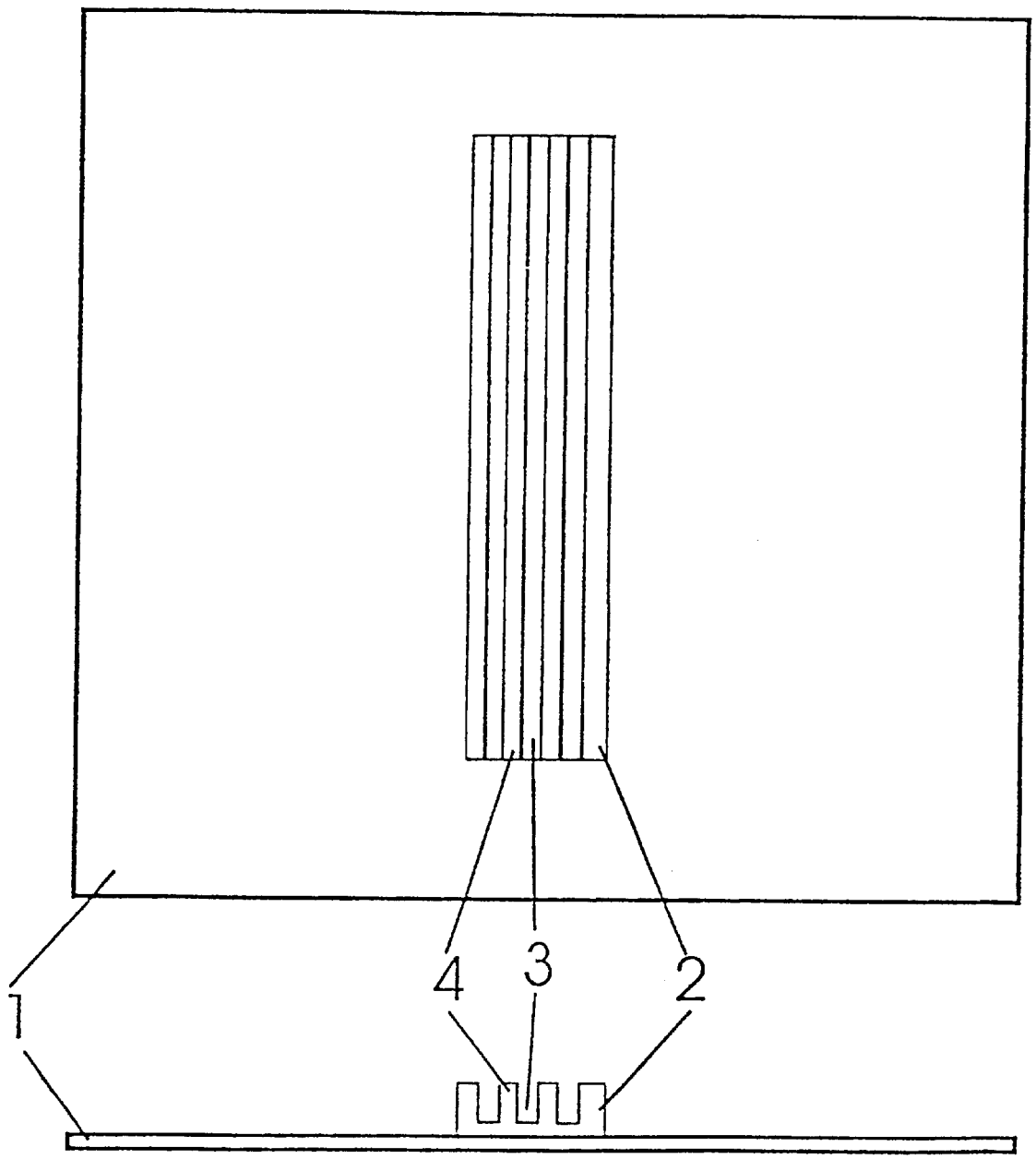
FIGS. 1*a* and 1*b* illustrate a conductor on an electronics device, said conductor having longitudinal etched grooves with a depth which is smaller than the thickness of the conductor.

FIG. 1a shows a printed circuit board, substrate or chip 1 which is provided with one or more conductors 2. FIG. 1b is a cross-sectional view of the device in FIG. 1a. This or these are provided with a surface structure in the form of longitudinal etched grooves 3. The grooves define flanges 4 in the conductor 2. The etched grooves 3 have a depth which is smaller than the thickness of the conductor 2. For the sake of clarity, it may here be mentioned that thickness means the thickness perpendicularly to the printed circuit board, substrate or chip. Owing to the design of the conductor 2 with flanges 4, the conductor 2 will have a larger circumferential surface. This means a reduction of the electric resistance at high working frequencies since the current at high frequencies is essentially carried at the circumferential surface. The larger circumferential surface also gives the conductor 2 better cooling. Air or some other cooling medium can pass the flanges 4 in the etched grooves 3 of the conductor 2.

Figure 2:
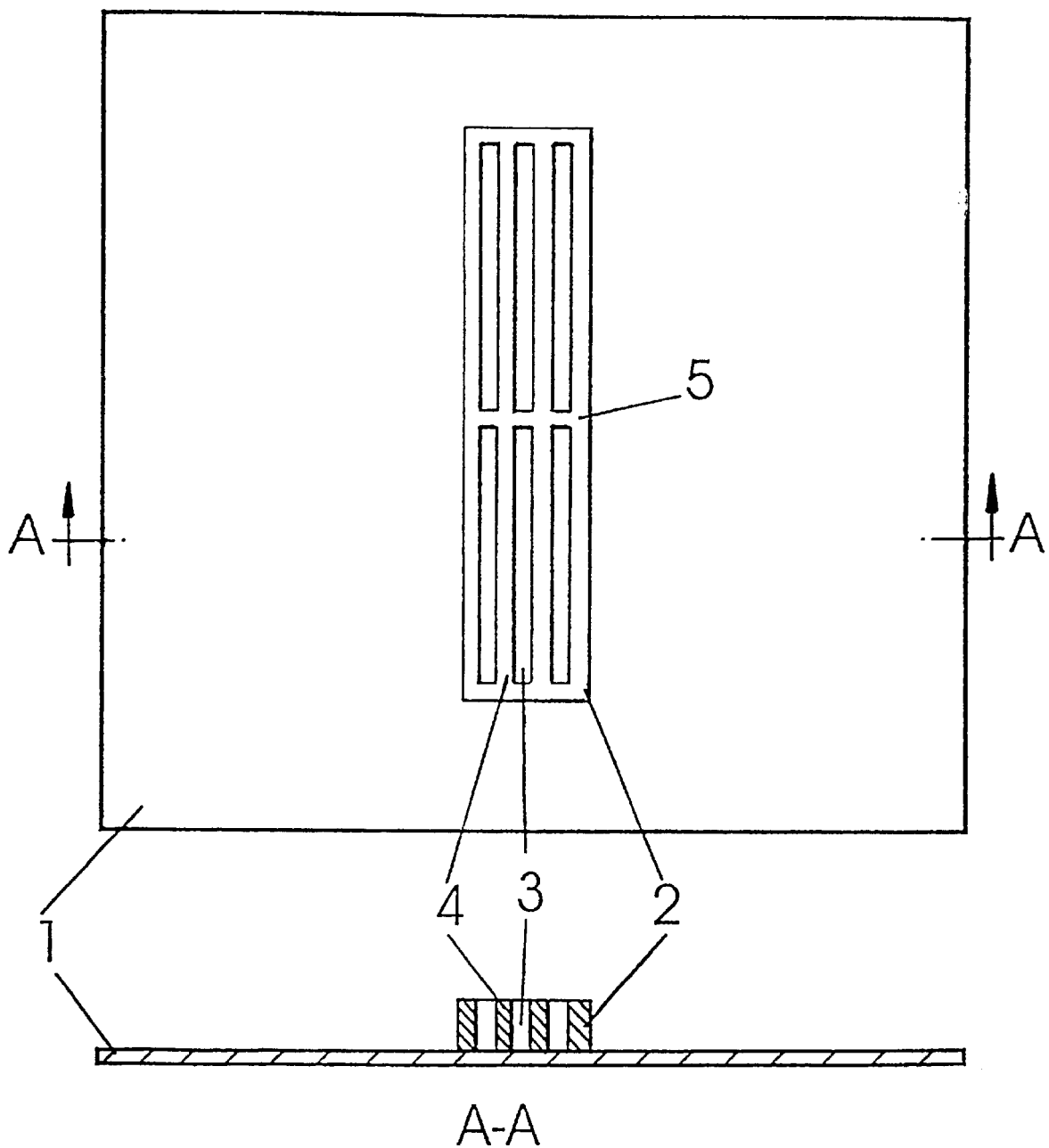
FIGS. 2a and 2b illustrate a conductor on an electronics device, said conductor having etched grooves the depth of which is as great as the thickness of the conductor. The conductor has transverse connections in certain positions along the length of the conductor so that the flanges do not form separate conductors.

FIG. 2a shows a printed circuit board, substrate or chip 1 which is provided with one or more conductors 2. FIG. 2b is a cross-sectional view of the device in FIG. 2a taken along the line A—A. This or these are provided with etched grooves 3, which gives the conductor 2 flanges 4. The etched grooves 3 have a depth which is equal to the thickness of the conductor 2. The conductor 2 has transverse connections 5 in some positions along the length of the conductor 2 so that the flanges 4 do not form separate conductors. Owing to the design of the conductor 2 with flanges 4, the conductor 2 will have a larger circumferential surface. This means that the electric resistance decreases at high working frequencies since the current at high frequencies is essentially carried at the circumferential surface. The enlarged surface also means that the conductor 2 will have a larger cooling surface. Air or some other cooling medium can pass the flanges 4 in the etched grooves 3 of the conductor 2.

Figure 3:
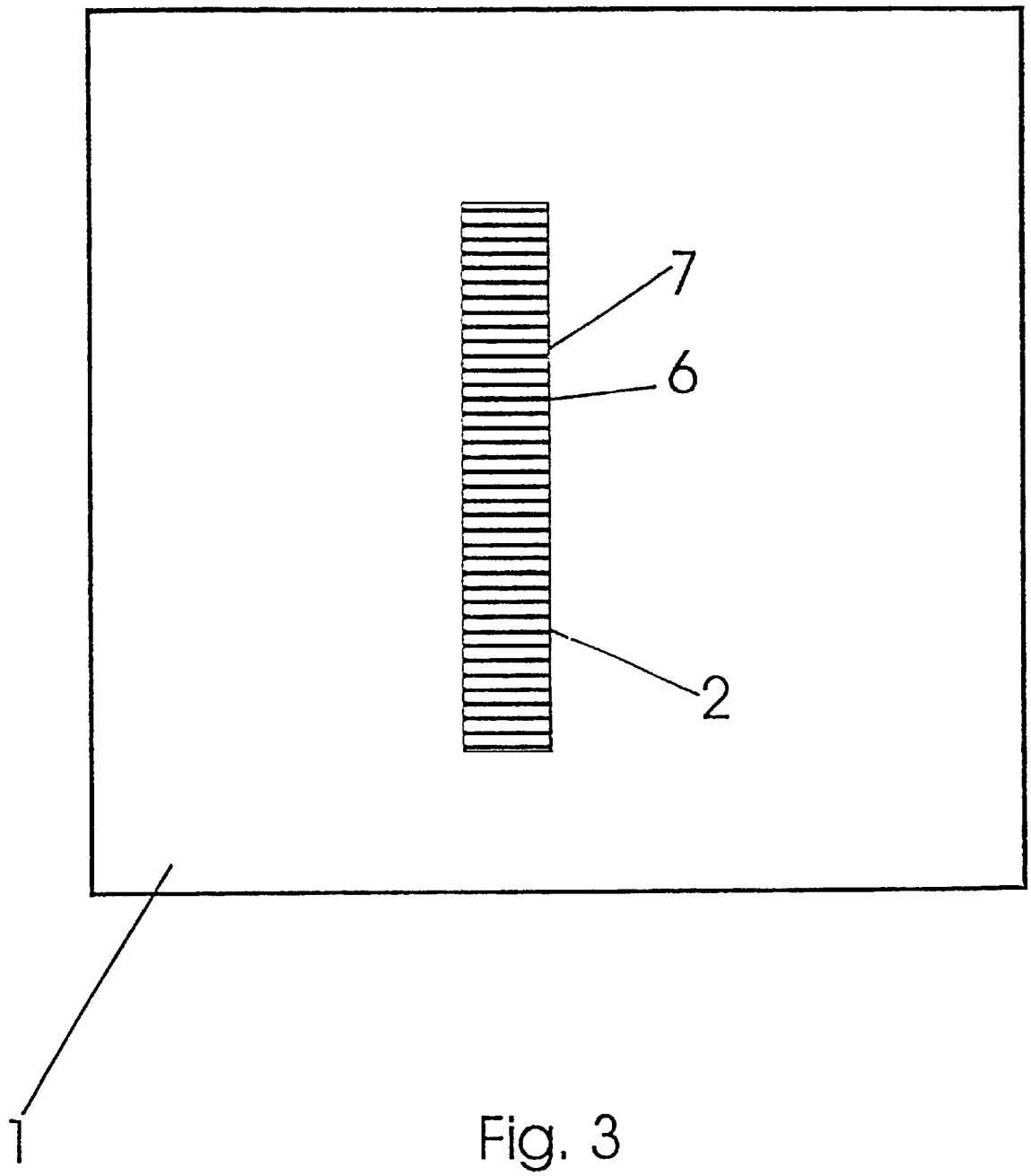
FIG. 3 illustrates a conductor on an electronics device, said conductor having transverse etched grooves with a depth which is smaller than the thickness of the conductor.

FIG. 3 illustrates a printed circuit board, substrate or chip 1 which is provided with one or more conductors 2. This or these are provided with transverse etched grooves 6, which gives the conductor 2 flanges 7. The etched grooves 6 have a depth which is smaller than the thickness of the conductor 2. Owing to the design of the conductor 2 with flanges 7, the conductor 2 will have a larger cooling surface. Air or some other cooling medium can pass in the etched grooves 7 of the conductor 2.

Figure 4:
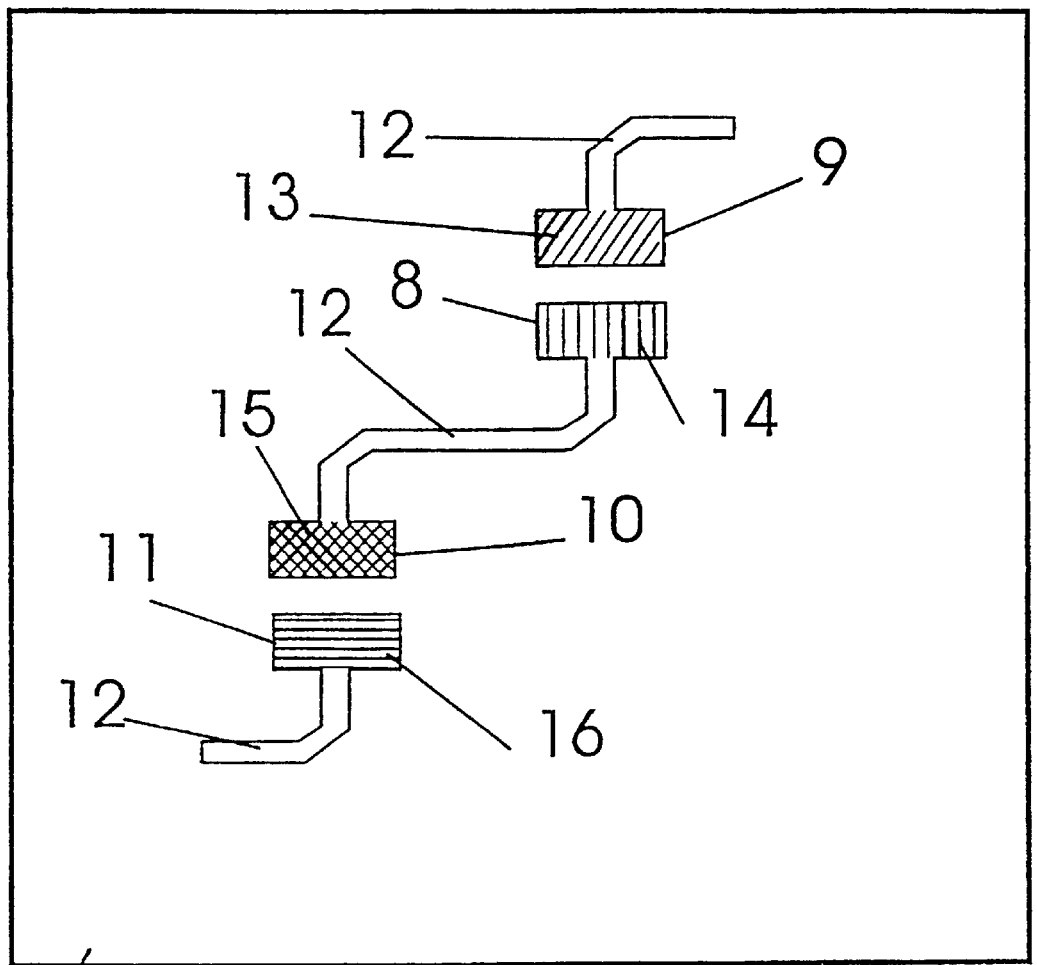
FIG. 4 illustrates a conductor with printed circuit board islands which are provided with patterns that have been etched to a depth which is smaller than the thickness of the conductor.

FIG. 4 shows conductors 12 which are connected to printed circuit board islands or connection areas 8, 9, 10, 11 which are provided with a pattern or surface structure to increase the strength in the joint which forms when components, such as resistors, capacitors, inductors, semiconductors etc, have been connected by soldering or gluing with an electrically conductive glue. The pattern on the printed circuit board islands 8, 9, 10, 11 can be designed in various ways. The printed circuit board island 8 shows that grooves 14 have been etched in the transverse direction of the mounting island 8. The printed circuit board island 9 shows that grooves 13 have been etched in the diagonal direction of the mounting island 9. The printed circuit board island 10 shows that grooves 15 have been etched in the double diagonal direction of the mounting island 10 so that the pattern forms a waffle pattern. The printed circuit board island 11 shows that grooves 16 have been etched in the longitudinal direction of the mounting island 11. The etched grooves have a thickness which is smaller than the thickness of the printed circuit board island. The extent of the grooves can alternatively be found merely in part of the extent of the mounting island. The grooves can have a depth equal to the thickness of the printed circuit board island if no parts are thereby electrically separated from the printed circuit board island. Owing to the design, the glue or soldering joint will have greater mechanical strength by the glue or soldering joint cooperating with a larger surface.

The embodiments described above are to be considered examples only. A person skilled in the art realizes that the above embodiments may be varied in a number of ways without deviating from the inventive idea.

We claim:

1. An electronics device comprising:

a carrier, an electric conductor on a surface of the carrier having a length, a surface of the conductor facing away from the carrier having a surface structure containing a plurality of flanges defined by etched grooves, the flanges extending essentially in a longitudinal direction of the conductor and essentially along the entire length of the conductor, and at least one connection area on the surface of the carrier connected to said electric conductor.

2. The electronics device of claim 1, wherein the conductor is located on a non-metallic surface of the carrier.

3. The electronics device of claim 1 or 2, wherein the grooves have a depth which is smaller than a thickness of the conductor, which thickness extends in a direction perpendicular to said surface of the carrier.

4. The electronics device of claim 1, wherein the grooves extend through a thickness of the conductor, which thickness extends in a direction perpendicular to said surface of the carrier, whereby the flanges form a plurality of separate subconductors, the conductor having at least one conductor portion that extends in a transverse direction of the conductor and connects the subconductors.

5. The electronics device of claim 1, wherein said at least one connection area has an etched surface structure.

6. The electronics device of claim 1, wherein the carrier is a printed circuit board, a substrate or a chip.

7. An electronics device comprising:

a carrier and an electric conductor on a surface of the carrier having a length, a surface of the conductor facing away from the carrier having a surface structure containing a plurality of flanges defined by etched grooves, the flanges extending essentially in a longitudinal direction of the conductor and essentially along the entire length of the conductor and the grooves having a depth which is smaller than a thickness of the conductor, which thickness extends in a direction perpendicular to said surface of the carrier.

8. The electronics device of claim 7, wherein the conductor is located on a non-metallic surface of the carrier.

9. The electronics device of claim 7, including at least one connection area on the surface of the carrier connected to said electric conductor and having an etched surface structure.

10. The electronics device of claim 7, wherein the carrier is a printed circuit board, a substrate or a chip.

* * * * *